(12) United States Patent
Dening et al.

(10) Patent No.: US 7,518,480 B1
(45) Date of Patent: Apr. 14, 2009

(54) PRINTED CIRCUIT BOARD INDUCTOR

(75) Inventors: David C. Dening, Stokesdale, NC (US); Theodora Hristova Ivanova, Summerfield, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 11/462,302

(22) Filed: Aug. 3, 2006

(51) Int. Cl.
 *H01F 5/00* (2006.01)
(52) U.S. Cl. ...................................... 336/200
(58) Field of Classification Search ............. 336/200
 See application file for complete search history.

(56) References Cited

U.S. PATENT DOCUMENTS

| | | | |
|---|---|---|---|
| 5,929,733 A * | 7/1999 | Anzawa et al. ............. 336/61 |
| 6,150,915 A | 11/2000 | O'Reilly et al. | |
| 6,542,379 B1 * | 4/2003 | Lauffer et al. ............. 361/793 |
| 6,786,708 B2 * | 9/2004 | Brown et al. ............. 417/413.3 |
| 6,867,678 B2 * | 3/2005 | Yang ........................ 336/200 |
| 6,990,725 B2 * | 1/2006 | Fontanella et al. ......... 29/602.1 |

OTHER PUBLICATIONS

Ludwig et al., "PCB Integrated Inductor for Low Power DC/DC Converter," IEEE Transactions on Power Electronics, Jul. 2003, pp. 937-945, vol. 18, No. 4, IEEE.

* cited by examiner

*Primary Examiner*—Elvin G Enad
*Assistant Examiner*—Joselito Baisa
(74) *Attorney, Agent, or Firm*—Withrow & Terranova, P.L.L.C.

(57) ABSTRACT

The present invention is an inductive element formed by a printed circuit board (PCB), which includes holes in the insulating layers that are filled with non-conductive material having high magnetic permeability, to reduce the magnetic reluctance of a magnetic path of the inductive element. Some embodiments of the present invention may use non-conductive materials having high magnetic permeability to connect the filled holes, such that a contiguous magnetic path is formed, which significantly reduces the reluctance of the contiguous magnetic path. Reducing the reluctance increases the inductance of the inductive element.

14 Claims, 5 Drawing Sheets

PRINTED CIRCUIT BOARD INDUCTOR

FIELD OF THE INVENTION

The present invention relates to printed circuit board (PCB) inductors, which may be used in power supply circuits.

BACKGROUND OF THE INVENTION

Portable battery powered devices, such as mobile telephones, Personal Digital Assistants, MP3 players, and the like, need to be low cost, low powered, and compact. Therefore, many such devices utilize switching power supplies to minimize space and power consumption. Switching power supplies use inductors as energy storage and filtering elements, and since many electronic devices use a printed circuit board (PCB) framework in their construction, PCB based inductors, which are also called PCB inductors, are often used in switching power supplies.

A PCB is a flat, laminated board with at least one layer of insulating material, and at least one layer of conducting material. Multilayer PCBs include alternating layers of insulating materials and conducting materials. Electrical circuits are formed by either etching away conducting materials, or adding conducting materials by plating or deposition. Typical conducting materials include copper, tin, lead, gold, and silver. Typical insulating materials include glass epoxies and resin-based preimpregnated materials (prepreg).

A PCB inductor is typically formed using a spiral pattern on at least one PCB conducting layer. The magnetic field of the inductor follows a magnetic path, which is orthogonal to the conduction path. The inductance is limited by the effective number of turns that can be formed, and the effective magnetic permeability of the magnetic path. One type of PCB inductor is shown in U.S. Pat. No. 6,996,892.

FIG. 1 shows the construction of a traditional inductor. A winding 10 is wrapped around a magnetic core 12. The number of times the winding is wrapped around the core is known as the number of turns N of the inductor. The magnetic core 12 may form a contiguous magnetic path, or a magnetic path with an air gap 14. The inductance L of the inductor is dependent upon N and the total reluctance $S_T$. Of the magnetic path, which is the sum of the core reluctance $S_C$ and the air gap reluctance $S_A$. L is equal to the product of N and the total flux $\phi$ in the inductor divided by the inductor current i. Magneto-motive force MMF is the driving force in a magnetic circuit, and is equal to the product of N and the inductor current i. Magnetic reluctance, also called reluctance S, is equal to magneto-motive force MMF divided by the total flux $\phi$, which is developed in response to the MMF. For a uniform magnetic circuit, reluctance S is equal to the length I of the magnetic circuit divided by the product of the cross-sectional area A, the magnetic permeability of free space $u_0$, and the relative magnetic permeability $u_r$ of the material forming the magnetic circuit. The following equations illustrate the dependencies of inductance L on the reluctances of the core and air gap $S_C$, $S_A$.

$$S=MMF/\phi=Ni/\phi \text{ or } \phi=Ni/S \quad \text{EQ. 1}$$

$$S=I/u_0u_rA \quad \text{EQ. 2}$$

$$\text{For the core—} S_C=I_C/u_0u_rA_C \quad \text{EQ. 3}$$

$$\text{For the air gap—} S_A=I_A/u_0A_A \quad \text{EQ. 4}$$

$$L=N\phi/i \quad \text{EQ. 5}$$

Now substituting EQ. 1 into EQ. 5:

$$L=N(Ni/S)/i=N^2/S=N^2/S_T=N^2/(S_A+S_C)$$

From EQ. 6, the inductance L is inversely proportional to the total reluctance $S_T$; therefore, the inductance can be increased by minimizing the total reluctance $S_T$, which is the sum of $S_A$ and $S_C$. The relationship of $S_A$ and $S_C$ can be analyzed by examining the ratio of $S_A$ to $S_C$ as shown below:

$$S_A/S_C=(I_A/u_0A_A)/(I_C/u_0u_rA_C) \quad \text{EQ. 7}$$

If the cross-sectional areas of the core and the gap are equal, then EQ. 7 reduces to:

$$S_A/S_C=u_r(I_A/I_C) \quad \text{EQ. 8}$$

From EQ. 8, if the relative magnetic permeability $u_r$ of the core material is 1000, which is not unusual, then even if the air gap length $I_A$ is only 1% of the core length $I_C$, the reluctance of the air gap $S_A$ is ten times greater than the reluctance of the core $S_C$. Therefore, the inductance is mainly determined by reluctance of the air gap $S_A$ and the number of turns N.

Since PCB inductors utilize insulating layers, which typically have low magnetic permeability, similar to that of air gaps, in their magnetic path, large inductance PCB inductors are not practical in many applications. Some PCB inductors use conductive layers of magnetic materials to help reduce total reluctance; however, cross-sectional areas are limited since the thicknesses of conductor layers are relatively thin and insulating layers are not eliminated. From the analysis in the previous paragraph, if low magnetic permeability gaps can be minimized or eliminated, PCB inductors with higher inductances can be constructed.

SUMMARY OF THE INVENTION

The present invention is an inductive element formed by a printed circuit board (PCB), which includes holes that are filled with non-conductive material having high magnetic permeability, to reduce the magnetic reluctance of a magnetic path of the inductive element. Some embodiments of the present invention may use non-conductive material having high magnetic permeability to connect the filled holes, such that a contiguous magnetic path is formed, which significantly reduces the reluctance of the contiguous magnetic path. Reducing the reluctance increases the inductance of the inductive element. Some embodiments of the present invention may use conductive material with high magnetic permeability to connect the filled holes, such that a contiguous magnetic path is formed.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is an inductive element formed by a printed circuit board (PCB), which includes holes that are filled with non-conductive material having high magnetic permeability, to reduce the magnetic reluctance of a magnetic path of the inductive element. Some embodiments of the present invention may use non-conductive material having high magnetic permeability to connect the filled holes, such that a contiguous magnetic path is formed, which significantly reduces the reluctance of the contiguous magnetic path. Reducing the reluctance increases the inductance of the inductive element. Some embodiments of the present invention may use conductive material having high magnetic permeability to connect the filled holes, such that a contiguous magnetic path is formed. Some embodiments of the present invention may use a single hole. The holes may be plated with a conducting material, or they may be completely insulating. The holes may be of any shape and size. The PCB may include one or more conductive layers. The PCB may include one or more insulating layers.

Figure 1:
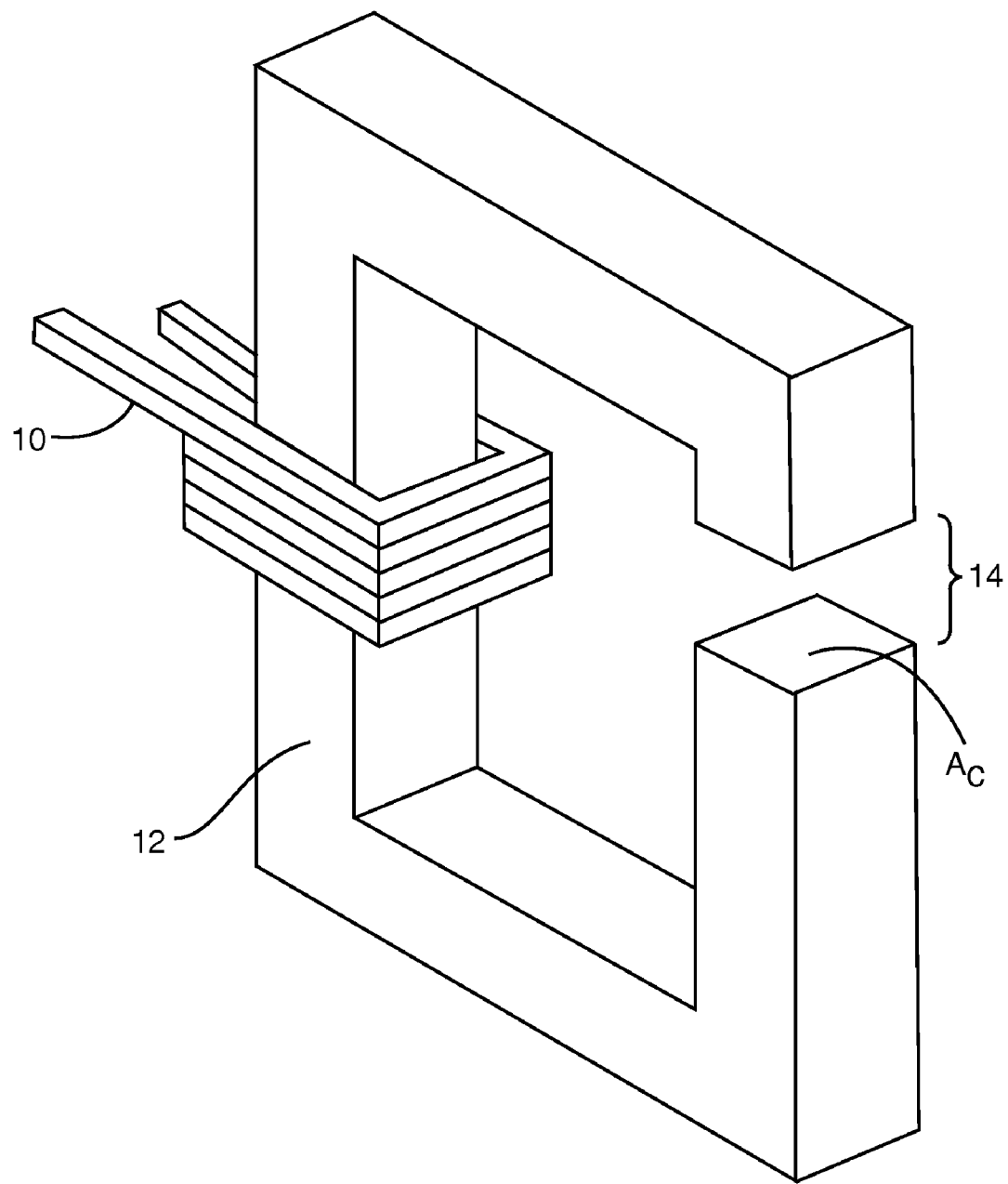
FIG. 1 shows the construction of a traditional inductor with a magnetic core and an air gap.
Figure 2:
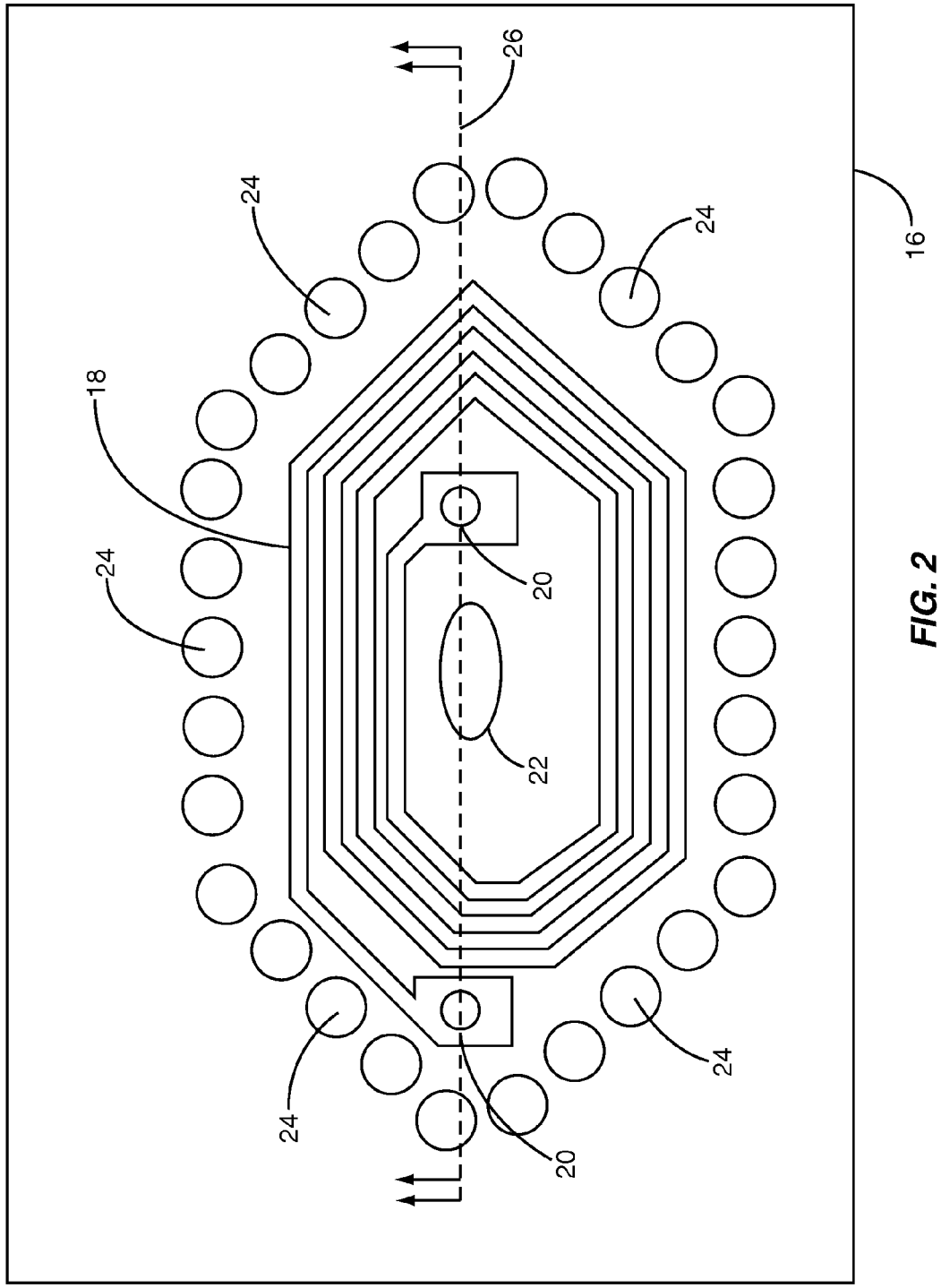
FIG. 2 shows the top side of a PCB inner core used in the present invention.

FIG. 2 shows the top side of a PCB inner core 16, which includes a non-conducting layer laminated to a conducting layer. The conducting layer has been etched away, leaving a metallic spiral pattern 18, which forms the conducting portion of an inductive element. Plated through holes 20 provide electrical connections to the conducting portion of the inductive element. An inner hole 22 contains non-conductive material having high magnetic permeability. Outer holes 24 contain non-conductive material having high magnetic permeability. The metallic spiral pattern 18 passes between the inner hole 22 and the outer holes 24 to reduce the magnetic reluctance of a magnetic path of the inductive element. A cross section 26 of the PCB inner core 16 is used in FIGS. 3 and 4.

Figure 3:
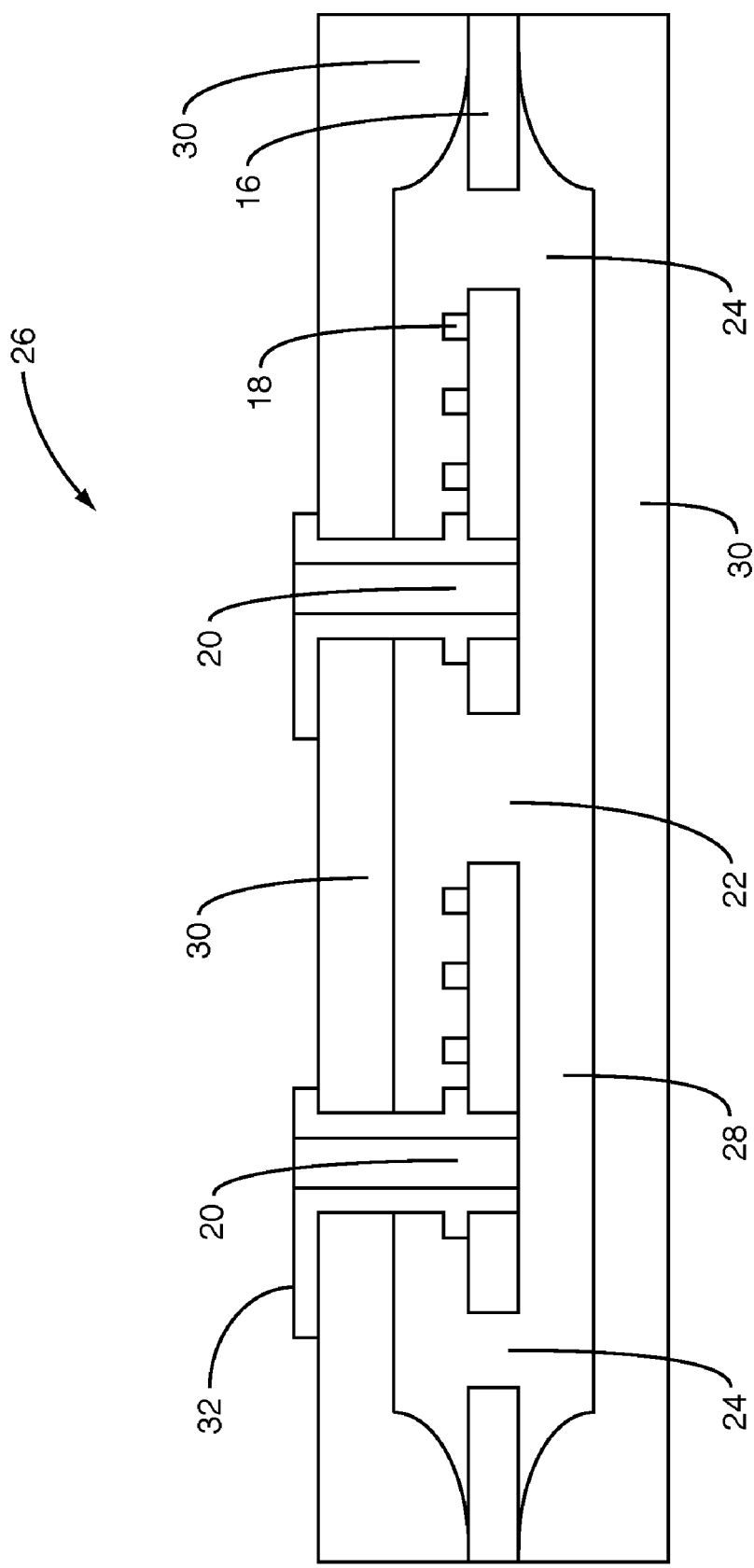
FIG. 3 shows a first embodiment of the present invention using a non-conductive material having high magnetic permeability to form contiguous magnetic paths.

FIG. 3 shows a first embodiment of the present invention, including a cross section 26 of the PCB inner core 16 of FIG. 2 with the metallic spiral pattern 18, the plated through holes 20, the inner hole of the top side 22, and the outer holes of the top side 24. Non-conductive, high magnetic permeability material 28 fills the inner and outer holes 22, 24, and magnetically connects the inner and outer holes 22, 24 on both the top side and bottom side of the PCB inner core 16. The non-conductive, high magnetic permeability material 28 completely encircles the metallic spiral pattern 18, thereby providing low reluctance magnetic paths for the inductive element, which allows high inductance values. A resin-based preimpregnated insulating material (prepreg) 30 is used to encapsulate the non-conductive, high magnetic permeability material 28, and provide a flat top side and bottom side finish. Metallic connections 32 to the metallic spiral pattern 18 are plated on top of the prepreg 30.

Figure 4:
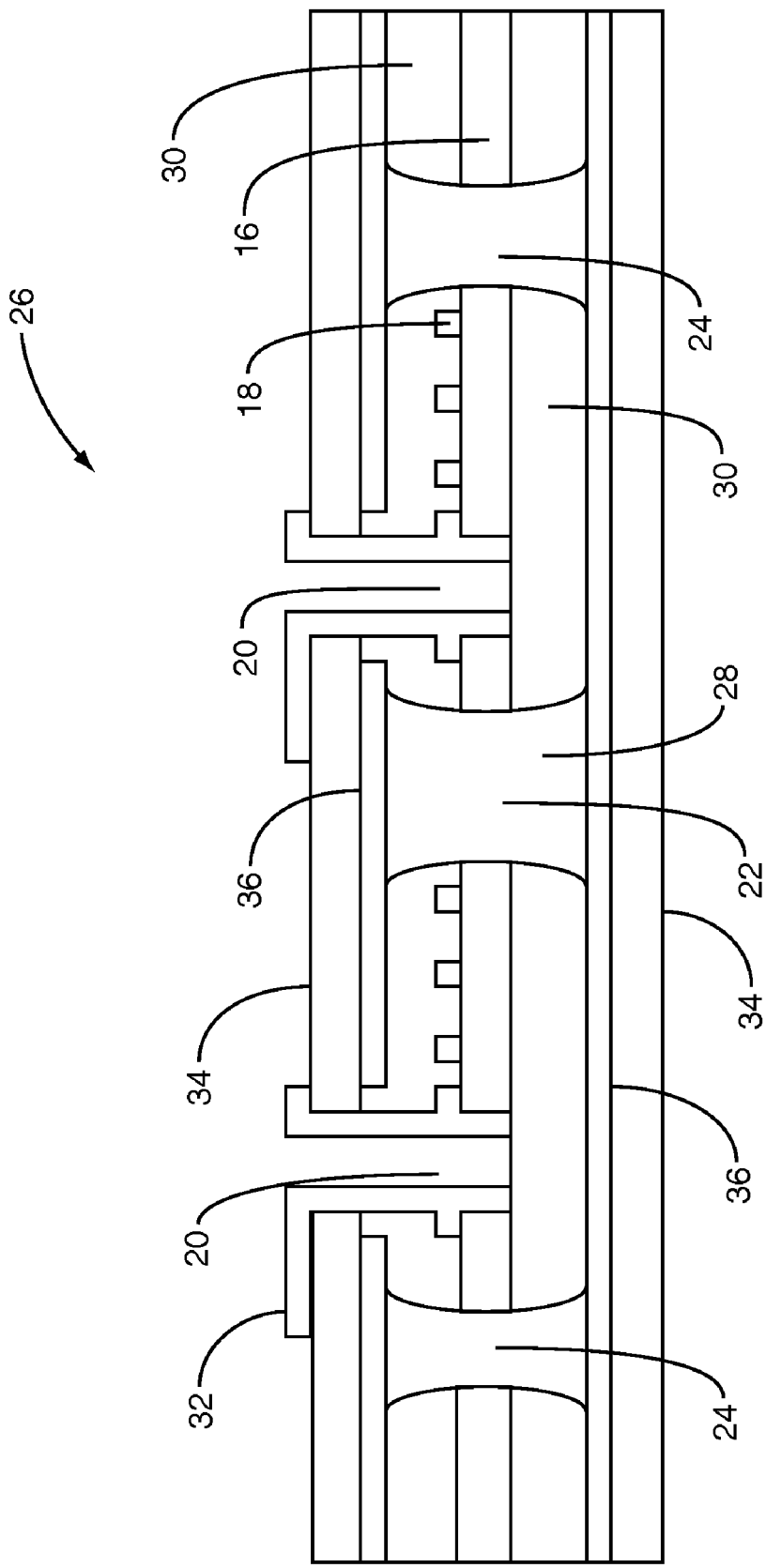
FIG. 4 shows a second embodiment of the present invention using a combination of conductive and non-conductive materials having high magnetic permeabilities to form contiguous magnetic paths.

FIG. 4 shows a second embodiment of the present invention, including a cross section 26 of the PCB inner core 16 of FIG. 2 with the metallic spiral pattern 18, the plated through holes 20, the inner hole 22, and the outer holes 24. Top and bottom PCB outer cores 34 are added to both sides of the PCB inner core 16. The PCB outer cores 34 include conductive, high magnetic permeability layers 36. Non-conductive, high magnetic permeability material 28 fills the inner and outer holes 22, 24, and magnetically connects the inner and outer holes 22, 24 on both the top side and bottom side of the PCB inner core 16 to the conductive, high magnetic permeability layers 36. The non-conductive, high magnetic permeability material 28 and conductive, high magnetic permeability layers 36 completely encircle the metallic spiral pattern 18, thereby providing low reluctance magnetic paths for the inductive element, which allows high inductance values. Prepreg 30 is used to fill the space between the PCB outer cores 34 and the PCB inner core 16. Metallic connections 32 to the metallic spiral pattern 18 are plated on top of the PCB outer core 34.

In one embodiment of the present invention, the non-conductive, high magnetic permeability material 28 may include nickel/zinc ferrite in an epoxy paste. The relative magnetic permeability of the non-conductive, high magnetic permeability material 28 may be greater than 100. Some of the holes 22, 24 may be slotted. In an exemplary embodiment of the present invention, the inductive element is used in a switching power supply circuit to provide power to a radio frequency (RF) power amplifier, as part of an RF transmitter.

Figure 5:
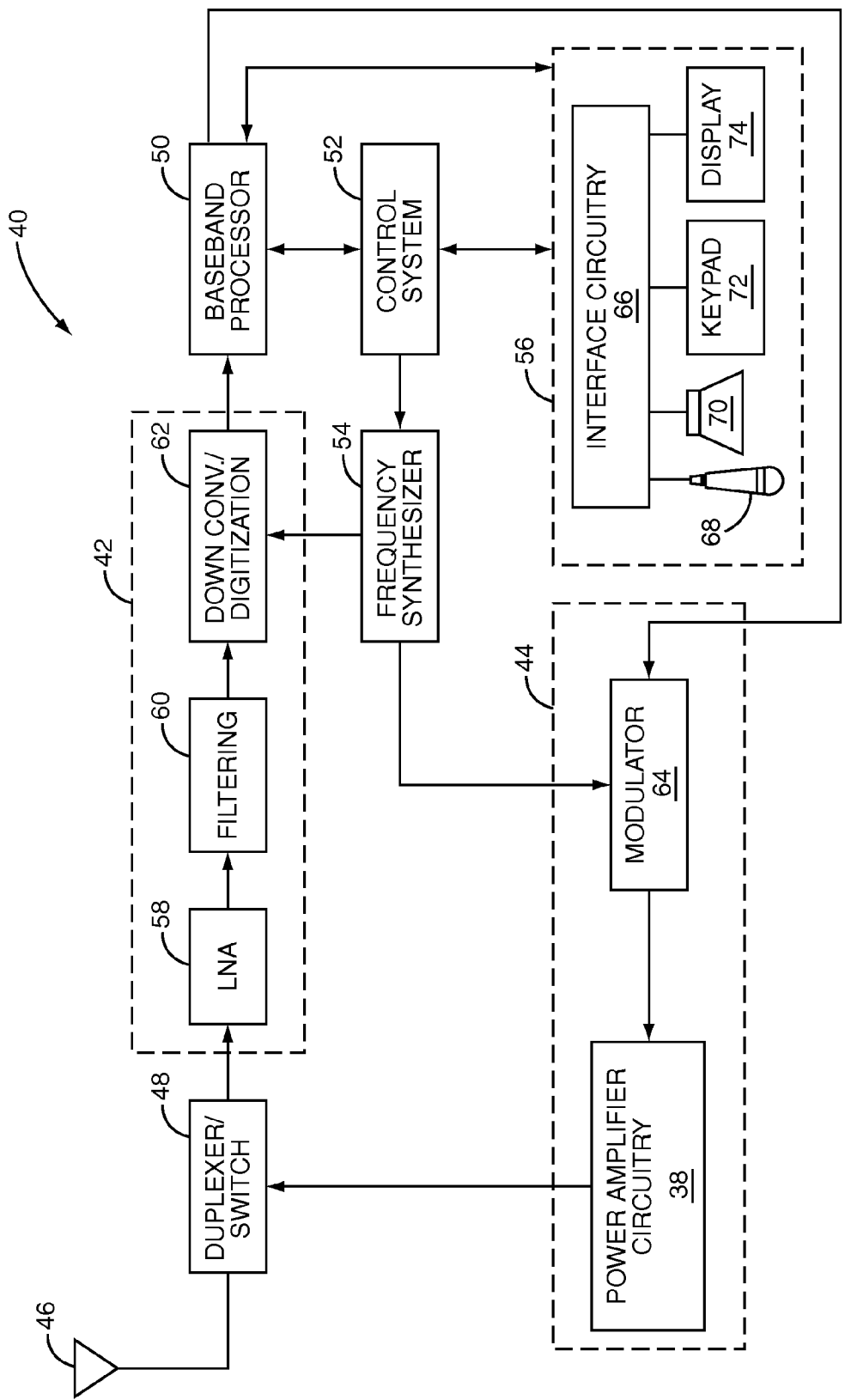
FIG. 5 shows an application example of the present invention used in a switching power supply in a radio frequency RF transmitter, which is used in a mobile terminal.

An application example of a PCB inductor is its use in a switching power supply included in power amplifier circuitry 38 in a mobile terminal 40. The basic architecture of the mobile terminal 40 is represented in FIG. 5 and may include a receiver front end 42, a radio frequency transmitter section 44, an antenna 46, a duplexer or switch 48, a baseband processor 50, a control system 52, a frequency synthesizer 54, and an interface 56. The receiver front end 42 receives information bearing radio frequency signals from one or more remote transmitters provided by a base station. A low noise amplifier (LNA) 58 amplifies the signal. A filter circuit 60 minimizes broadband interference in the received signal, while downconversion and digitization circuitry 62 downconverts the filtered, received signal to an intermediate or baseband frequency signal, which is then digitized into one or more digital streams. The receiver front end 42 typically uses one or more mixing frequencies generated by the frequency synthesizer 54. The baseband processor 50 processes the digitized received signal to extract the information or data bits conveyed in the received signal. This processing typically comprises demodulation, decoding, and error correction operations. As such, the baseband processor 50 is generally implemented in one or more digital signal processors (DSPs).

On the transmit side, the baseband processor 50 receives digitized data, which may represent voice, data, or control information, from the control system 52, which it encodes for transmission. The encoded data is output to the transmitter 44, where it is used by a modulator 64 to modulate a carrier signal that is at a desired transmit frequency. The power amplifier circuitry 38 amplifies the modulated carrier signal to a level appropriate for transmission, and delivers the amplified and modulated carrier signal to the antenna 46 through the duplexer or switch 48.

A user may interact with the mobile terminal 40 via the interface 56, which may include interface circuitry 66 associated with a microphone 68, a speaker 70, a keypad 72, and a display 74. The interface circuitry 66 typically includes analog-to-digital converters, digital-to-analog converters, amplifiers, and the like. Additionally, it may include a voice encoder/decoder, in which case it may communicate directly with the baseband processor 50. The microphone 68 will typically convert audio input, such as the user's voice, into an electrical signal, which is then digitized and passed directly or indirectly to the baseband processor 50. Audio information encoded in the received signal is recovered by the baseband processor 50, and converted by the interface circuitry 66 into an analog signal suitable for driving the speaker 70. The keypad 72 and display 74 enable the user to interact with the mobile terminal 40, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. An inductive element comprising:
    a printed circuit board (PCB) inner core comprising:
        a non-conducting layer having at least one inner hole and a plurality of outer holes disposed about the at least one inner hole; and
        a metallic spiral pattern laminated to the non-conducting layer, such that the metallic spiral pattern encircles the at least one inner hole and the plurality of outer holes is distributed about the metallic spiral pattern such that the plurality of outer holes completely encircles the metallic spiral pattern; and
    non-conductive high magnetic permeability material substantially covering both sides of the PCB inner core and substantially filling the at least one inner hole and the plurality of outer holes, such that the non-conducting layer and the non-conductive high magnetic permeability material substantially completely surround the metallic spiral pattern, and the non-conductive high magnetic permeability material provides at least one contiguous magnetic path through the at least one inner hole, over the metallic spiral pattern, through the plurality of outer holes, and under the metallic spiral pattern.

2. The inductive element of claim 1 wherein the non-conductive high magnetic permeability material comprises epoxy, Zinc, Nickel, and Iron.

3. The inductive element of claim 1 wherein the non-conductive high magnetic permeability material comprises epoxy, Zinc, and Nickel.

4. The inductive element of claim 1 wherein the non-conductive high magnetic permeability material comprises epoxy and Zinc.

5. The inductive element of claim 1 wherein the non-conductive high magnetic permeability material comprises epoxy and Nickel.

6. The inductive element of claim 1 wherein a pair of the plurality of outer holes are separated by a distance and each of the plurality of outer holes has a diameter, such that the distance is less than the diameter.

7. The inductive element of claim 1 wherein the plurality of outer holes is approximately evenly distributed about the metallic spiral pattern.

8. The inductive element of claim 7 wherein each of the plurality of outer holes has about a same diameter as other of the plurality of outer holes.

9. The inductive element of claim 8 wherein each of the plurality of outer holes is substantially circular.

10. The inductive element of claim 1 wherein a relative magnetic permeability of the non-conductive high magnetic permeability material is greater than 100.

11. The inductive element of claim 1 further comprising a first insulating layer over the non-conductive high magnetic permeability material.

12. The inductive element of claim 11 wherein the first insulating layer comprises preimpregnated insulating material.

13. The inductive element of claim 1 further comprising a first insulating layer and a second insulating layer, such that the PCB inner core and the non-conductive high magnetic permeability material are between the first insulating layer and the second insulating layer.

14. The inductive element of claim 13 wherein the first insulating ayer and the second insulating layer comprise preimpregnated insulating material.

* * * * *

UNITED STATES PATENT AND TRADEMARK OFFICE
CERTIFICATE OF CORRECTION

| | | |
|---|---|---|
| PATENT NO. | : 7,518,480 B1 | Page 1 of 1 |
| APPLICATION NO. | : 11/462302 | |
| DATED | : April 14, 2009 | |
| INVENTOR(S) | : Dening et al. | |

It is certified that error appears in the above-identified patent and that said Letters Patent is hereby corrected as shown below:

In column 6, at line 43, please change "ayer" to --layer--.

Signed and Sealed this

Seventh Day of July, 2009

JOHN DOLL
*Acting Director of the United States Patent and Trademark Office*